United States Patent [19]
Perrin et al.

[11] Patent Number: 5,982,253
[45] Date of Patent: Nov. 9, 1999

[54] IN-LINE MODULE FOR ATTENUATING ELECTRICAL NOISE WITH MALE AND FEMALE BLADE TERMINALS

[75] Inventors: Randall L. Perrin; Matthew W. Taylor; John M. Washeleski, all of Cadillac, Mich.

[73] Assignee: Nartron Corporation, Reed City, Mich.

[21] Appl. No.: 08/918,918

[22] Filed: Aug. 27, 1997

[51] Int. Cl.⁶ ............................. H03H 7/01; H01R 13/66
[52] U.S. Cl. ......................... 333/182; 333/185; 439/620
[58] Field of Search .................................. 333/181, 182, 333/185, 12; 439/620

[56] References Cited

U.S. PATENT DOCUMENTS

| | | | |
|---|---|---|---|
| 4,384,331 | 5/1983 | Fukuhara et al. | 333/12 X |
| 4,462,012 | 7/1984 | Kerber et al. | 333/185 X |
| 4,698,605 | 10/1987 | Imamura et al. | 333/184 |
| 4,800,348 | 1/1989 | Rosar et al. | 333/202 |
| 4,992,060 | 2/1991 | Meyer | 333/12 X |
| 5,236,376 | 8/1993 | Cohen | 439/620 |
| 5,500,629 | 3/1996 | Meyer | 333/181 |

FOREIGN PATENT DOCUMENTS

| | | | |
|---|---|---|---|
| 2602920 | 2/1988 | France | 439/620 |
| 7603783 | 11/1976 | Netherlands | 439/620 |

*Primary Examiner*—Justin P. Bettendorf
*Attorney, Agent, or Firm*—Brooks & Kushman P.C.

[57] ABSTRACT

An interchangeable, plug-in, in-line module for attenuating electrical noise wherein a plurality of plug-in terminals are electrically coupled to an attenuating circuit in the form of a filter network array including a plurality of discrete components electrically interconnected by conductive traces or printed circuits formed on an insulating board to facilitate a plug-in connection to an electrical system. The attenuating circuit is electrically connected to a conductive retainer which is adapted to receive and retain a plastic motor end cover therein and to make electrical contact with a conductive frame member of the motor. The attenuating circuit includes four ferrite choke beads each having axial through holes or bores through which through-connectors of the terminals pass. The choke beads are supported by an insulating carrier so that the through-connectors can be electrically coupled to the conductive traces.

4 Claims, 3 Drawing Sheets

IN-LINE MODULE FOR ATTENUATING ELECTRICAL NOISE WITH MALE AND FEMALE BLADE TERMINALS

TECHNICAL FIELD

This invention relates to in-line modules and, in particular, to in-line modules for attenuating electrical noise such as radio frequency interference.

BACKGROUND ART

With ever increasing applications and utilization of electrical and electronic control systems composed of sensors, control electronics, and actuators, there are concurrent and ever increasing technical difficulties pertaining to reliable implementation thereof. Additionally, urgency in rushing product development to facilitate getting devices to market, ongoing incremental technical developments, and desires to include upgraded functional features increasingly cause product obsolescence prior to end of life failure.

Numerous new sensors are constantly being developed, many of which push the limits of physical properties and principles. Some sensors transduce very small changes in physical signals with high resolution and accuracy into low voltage, low current, high impedance analog electrical signals. Modern control system electronics typically tend toward various features including: higher clock frequencies; higher switching slew rates; lower voltages; lower and higher currents; widely distributed controls; direct digital control of power electronics; wider environmental operating conditions; and wire harnesses containing mixed conductor types of analog, digital, and power conductors.

Improvements in modern electronic control systems, power electronic components, and high power electrical actuators now enable sophisticated control of electrical transducing actuators to perform tasks previously practical only by other non-electrical methods. High power actuators, now in typical use, require high levels of voltage and/or current. One result of these technological advancements in sensing, electronics, and actuators is numerous new opportunities for electrical noise caused by various transients and frequencies of voltages and currents of a system to interfere with another system or even with itself. Witness the numerous standards issued by major technical societies and industrial nations pertaining to allowable levels of wideband radio frequency interference (RFI) emissions and susceptibility via conduction and field transmission. An additional result is obsolescence (sometimes planned) of existing electrical and electronic devices by new, improved devices offering additional features.

Interference noise from zero Hz through RF is transmitted via four major methods consisting of: Electric field (e-field), magnetic field (m-field), electromagnetic (EM) field, and conduction. The fields are transmitted via contactless transmission. Conducted transmission is essentially electrical energy passing via direct electrical connection. High voltages produce strong e-fields. High currents produce strong m-fields. High voltages and/or high electrical currents oscillating at high frequencies or high acceleration of charges produce strong EM fields. EM fields from the very low frequency (long wavelengths on scale of kilometers and longer) to extremely high frequency (short wavelengths on scale of molecules and shorter) are generally composed of orthogonal coupled e-fields with m-fields which emanate at the speed of radio waves in that medium and which may also have such characteristics as being polarized, rotating, coherent, or incoherent. EM antenna characteristics of a device at a given frequency relate to geometry, conductivity, and dielectric coupling with its environment. A device which is a good field emitting or transmitting antenna with high emissivity characteristics is generally also a good field receiving antenna with associated high susceptibility characteristics.

Undesired interference is called noise. Not all interference is man-made. Natural phenomena which product high (RF) and/or low frequency interference include: solar wind (atmospheric ionization), electrical storms (lightning), static electricity discharge (sparks), geomagnetic storms (ground currents), and more. Many sources of interference are man-made devices operating as designed and in other cases, not operating as intended. Newer electronic devices and systems tend to be more sensitive and thus can be more affected by various natural and man-made sources of interference. It is possible that devices engineered and manufactured to older specifications can produce interference which is not readily apparent to the casual observer but which can have catastrophic effect upon susceptible devices.

Electromagnetic compatibility (EMC) is here understood to relate to components, devices, and systems compatible with respect to transmitted and/or received via conduction and/or field transmission, especially in the RF spectrum. Typical specifications relate quantities and durations of anomalous system operation allowed versus quantity of interference of various types, examples of which a system output may have are: no effect, temporary effect on performance or accuracy, permanent effect on performance or accuracy, and functional death of the system. Critical safety related applications mandate a very high reliability and tolerance to all types of interference and environmental conditions. Modern application customers expect and demand reliable operation from all components and systems under all anticipated operating conditions. The need increasingly exists for systems and component devices to reduce both interference emitted and susceptibility to external noise emissions received.

One significant source of electrical noise is motors for which currents and voltages are switched or commutated. This includes direct current (DC) motors and also some types of alternating current (AC) motors such as AC commutator motors, universal motors, and motors for which the alternating currents are generated by switching inverter circuits. Motors can be particularly noisy under certain transient conditions, for example, high startup current, stalled rotor, and overspeed of an under-loaded series DC motor. For many of the existing motor designs in production and common use, it is desired simply to attenuate the RFI noise which they produce to maintain compliance with newer EMC regulations. It is common knowledge that various types of motor operation emit noise that can be detected by radio or television receivers.

Modern motor applications can include electrical analog and digital signal-carrying wires to and from the motor along with the power supply wires. These signals are typically used with closed loop feedback control and safety systems for monitoring and control of such motor parameters as position (rotary or linear), velocity, acceleration, stator and armature resolver and encoder voltage waveforms, stator and armature current and voltage waveforms, rotor torque (also the linear motor analog of force), stator and armature temperatures, and the like.

In various applications, signal processing circuitry (analog and/or digital) is incorporated: (1) within the motor housing; (2) attached to the motor; (3) near but separate from the motor; or (4) remote from the motor. This control circuitry and thus the system functional operation can potentially be detrimentally affected by noise generated within the motor itself and/or by outside sources and transmitted by: motor wiring, magnetic fields, electric fields, or via EM fields. New demand and consideration are being given for use of multiple critical and sensitive low-level and/or high speed analog and/or digital motor sensing and control circuits which are potentially sensitive to RFI conduction, emissivity and susceptibility.

U.S. Pat. No. 4,698,605 discloses an electronic filter component for attenuation of high frequency conducted electrical current noise of a single conductor (and thus its associated radiated noise), being comprised simply of a cylinder of semiconductor ferrite having also some capacitive properties imparted by virtue of metallizing the outer circumference and optionally the inner bore such that with or without ohmic contact of the conductor with the inner metallized bore the component will have properties of distributed inductance and capacitance to perform in the functional capacity as a low pass common mode electronic current filter.

U.S. Pat. No. 4,992,060 discloses an electronic filter device having a standard ferrite component with no metallization. Inner metallization is functionally supplied by a metal shield around the wire bundle. Outer metallization is functionally supplied and held proximal the inside of the connector shell, shaped to be captive and protected within the connector housing, and optionally being axially split to fit within the two halves of the connector. The component is integral within at least one end of a shielded cable connector for attenuation of high frequency conducted electrical current noise primarily of the shield of a shielded conductor bundle (and thus also its associated radiated noise). The ferrite, making metal contact on its inner and outer cylindrical surfaces, also has some capacitive properties imparted by virtue of the metallic contact with the outer circumference and the inner bore such that properties of distributed inductance and capacitance result in the functional capacity as a low pass common mode electronic current filter.

U.S. Pat. No. 5,500,629 discloses an electronic filter component for attenuation of high frequency conducted electrical current noise (and thus its associated radiated noise) of a single conductor (and/or with multiple use for multiple conductors), being comprised simply of a sandwich-like shape of special types of engineered non-linear ferrite having inductive, resistive, and capacitive properties in bulk and also some capacitive properties imparted by virtue of metallizing electrical contact areas such that the component will have properties of transient clipping with distributed inductance and capacitance to perform in the functional capacity as a low pass common mode electronic current filter.

U.S. Pat. No. 4,800,348 discloses an adjustable electronic filter including dielectric block having one or more through holes.

For applications using both existing and new motors, an emerging need exists for reliable methods to control noise, especially RFI noise, both where generated and where received.

Significant opportunity lies not only in new replacement devices meeting updated electrical-related interference noise specifications but also in modular in-line retrofit and/or optional modular in-line device additions to existing and even new systems rendering improved interface and/or optional functional capabilities.

SUMMARY OF THE INVENTION

An object of the present invention is to provide an in-line module for attenuating electrical noise such as RFI noise in a reliable fashion.

Another object of the present invention is to provide an in-line module for attenuating electrical noise in an electrical system including an electrical machine such as an electrical motor in a reliable fashion wherein the noise is controlled both where generated and where received.

Another object of the present invention is to provide an interchangeable plug-in module for attenuating electrical noise such as RFI noise both where generated and where received.

Yet still another object of the present invention is to provide an in-line module for attenuating electrical noise wherein the in-line module is plug compatible and is essentially a modular low pass electronic filter for an electrical motor wherein no wiring change is required for the electrical motor.

In carrying out the above objects and other objects of the present invention, an in-line module for attenuating electrical noise is provided. The in-line module includes an attenuating circuit including a plurality of discrete components and interconnecting conductive traces or printed circuits formed on a printed circuit (PC) board. Some of the discrete components have a cylindrical ferromagnetic body with an axial bore extending through a central portion thereof. The in-line module also includes a plurality of terminals. Each of the terminals has a through-connector disposed in the axial bore of its respective cylindrical ferromagnetic body and magnetically coupled therewith and electrically coupled with its respective conductive trace. The terminals facilitate the connection of the in-line module in an electrical system and pass current through the cylindrical ferromagnetic bodies. Finally, the in-line module includes an insulating support subassembly, (i.e. otherwise known as a carrier subassembly), for supporting the cylindrical ferromagnetic bodies and the terminals.

Further in carrying out the above objects and other objects of the present invention, an in-line module for attenuating electrical noise in an electrical device is provided. The in-line module includes an attenuating circuit including a plurality of discrete components and an insulating support assembly for supporting the circuit including the discrete components. The in-line module also includes a protective housing cover which mechanically connects via snaps to a base which is mechanically retained between a PC board and a retainer by rivets to enclose a carrier subassembly with the PC board. The retainer is adapted for mechanical and electrical connection with an electrically conductive frame member of the device. Finally, the in-line module includes input and output terminals connected to the circuit to facilitate electrical connection of the electrical device within an electrical system.

Still further in carrying out the above objects and other objects of the present invention, an interchangeable, plug-in module for attenuating electrical noise is provided. The module includes an attenuating circuit including a plurality of discrete components and interconnecting conductive traces or strips. The module also includes a plurality of plug-in terminals electrically coupled to the discrete components and mounted to the conductive traces to facilitate a plug-in connection to an electrical system. Each of the terminals is mounted to its respective conductive trace at an end portion of its through-connector. Finally, the module includes an insulating support assembly, including a housing cover, carrier subassembly and a base for supporting the carrier subassembly with the plug-in terminals, the discrete components and the insulating board having the traces and connections.

Some of the discrete components are preferably inductors formed as ferrite choke beads.

In a preferred embodiment of the invention, the circuit is a symmetrical RFI noise suppression filter network array having an attenuation transfer function.

Further in carrying out the above objects and other objects of the present invention, an in-line module for attenuating electrical noise is provided. The in-line module includes a board having printed circuits formed thereon and an attenuating circuit including a first set of discrete components mounted on the board and a second set of discrete components electrically connected to the first set of discrete components. Each of the second set of discrete components has a cylindrical body with an axial bore extending through a central portion thereof. The module also includes a plurality of terminals. Each of the terminals has a through-connector disposed in the axial bore of its respective cylindrical body and coupled therewith and with its respective printed circuit. The terminals facilitate the connection of the in-line module in an electrical system and pass current through the cylindrical bodies.

Further in carrying out the above objects and other objects of the present invention, an in-line module for attenuating electrical noise in an electrical device is provided. The in-line module includes a board having printed circuits formed thereon, a carrier subassembly and an attenuating circuit including first and second sets of discrete components. The first set of discrete components are mounted on the board and the second set of discrete components are mounted on the carrier subassembly. The in-line module also includes a housing for housing the board and carrier subassembly and a retainer electrically connected to the attenuating circuit and adapted for mechanical and electrical connection with an electrically conductive frame member of the device to provide shielding. The in-line module also includes terminals connected to the attenuating circuit to facilitate an electrical connection of the electrical device within an electrical system.

Still further in carrying out the above objects and other objects of the present invention, an interchangeable plug-in module for attenuating electrical noise is provided. The module includes a board having printed circuits formed thereon and an attenuating circuit including first and second sets of discrete components. The module also includes a plurality of plug-in terminals electrically coupled to the first and second sets of discrete components and mounted to the printed circuits to facilitate a plug-in connection to the electrical system. The first set of discrete components are mounted on the board. The module also includes a carrier subassembly for supporting the second set of discrete components and the plug-in terminals.

When the electrical machine is a motor, the housing assembly preferably includes a hollow retainer electrically connected to the circuit and adapted to receive and retain a motor end cover therein and make multiple gas-tight, metallurgical and electrical contacts with a conductive frame member of the motor. The retainer provides shielding. Preferably, the in-line module also includes a plurality of spaced terminations for electrically connecting the circuit to the retainer. The attenuation transfer function is a function of the quantity, quality and location of the terminations.

Also, preferably, the plug-in terminals includes male and female terminals. The male terminals are, preferably, blade terminals.

Although the preferred embodiment of the in-line module is a radio frequency interference, noise suppression module specific for motor application, various other wide ranging potential applications exist which include, but are not limited to a modular device incorporating any and/or all of the following:

1) A connector for in-between plug-in, in-between spline-in, and/or as a splice-onto device connection as a retrofit or as a design in for use with existing host device (motor) system wiring thus avoidance of change to an existing system wiring harness and/or connector can also include additional functions, circuit inputs and/or outputs, integral and/or remote, wired and/or contactless;

2) A modified wiring bundle pigtail and/or connector to alter interference noise conductivity characteristics plus field emissivity and susceptibility characteristics;

3) A physical design to become an integral add-on to an existing host device (motor);

4) Capability as a heat source and/or an extended heat sink for the host device (motor) using passive and/or active methods including resistive heating, fan, thermoelectric, and refrigeration;

5) Capability as an active and/or passive noise and/or vibration attenuation device for the host device (motor) via elastomeric mount(s), sound shield, anti-sound or anti-vibration transducer(s);

6) Capability to actively and/or passively modify host device system functions, power(s) and signal(s) to affect altered and/or new system function(s);

7) Added wires and/or connectors for host device system use;

8) Added inputs, integral or remote, and associated wiring and terminations—ex. microphone for voice recognition;

9) Added outputs, integral or remote, and associated wiring and terminations—ex. speaker for voice simulation;

10) Added functions, integral or remote, active and/or passive which include: system monitoring and control, attenuation of conducted electrical noise transmission, attenuation of all field transmission modes, and modification of system signals to affect altered system functional performance—ex. voice recognition and speech processing;

11) A metal base—electrically connected to and integral with host device giving bidirectional shielding effect to and from field transmission modes, zero Hz through RF;

12) An electrically integral conductive housing; possibly electrically isolated, possibly common with an electrically floating host device and/or host device (motor) chassis, possibly common with any single wire to or from the host device (motor), possibly common with a node created within the device module, and possibly grounded—giving bidirectional shielding effect to and from all field transmission modes, zero Hz through RF;

13) A housing giving physical protection of and/or environmental contamination sealing protection for: mating host device (motor), mating host device (motor) device terminals, mating host device (motor) terminals, internal module shield(s) and module electronic filter network array;

14) Bidirectional conducted electrical transmission noise interference filter network active and/or passive electronic array giving attenuation from zero Hz through RF;

15) Inductive choke ferrite beads, magnetic material, and/or conductive rings placed onto an electrical terminal(s) for conducted electrical noise transmission attenuation;

16) Bidirectional m-field transmission noise interference attenuation via passive magnetic shield(s) and/or active field sensing and cancellation; zero Hz through RF;

17) Bidirectional e-field transmission noise interference attenuation via passive electrical conductive shield(s) and/or active field sensing and cancellation; zero Hz through RF;

18) Bidirectional EM field transmission noise interference attenuation via passive electrical conductive electromagnetic shield(s) and/or active field sensing and cancellation; zero Hz through RF;

19) Bidirectional active and/or passive electrostatic discharge immunity via diode protection, static dissipative materials, and static sensing circuit(s);

20) Bidirectional active and/or passive overvoltage protection immunity and functions typically via: fuse blowing, breaker opening, crowbar circuit—manual reset or automatic reset with return to normal voltage or power up or other functional condition;

21) Bidirectional active and/or passive undervoltage protection immunity and functions typically via dropout function performed via solid state or via relay circuit—manual reset or automatic reset with return to normal voltage or power up or other functional condition;

22) Reverse voltage protection immunity and functions via passive blocking diode and/or active methods;

23) Bidirectional active and/or passive short circuit protection and functions via fuse, positive temperature coefficient resistor, bimetallic temperature switch, temperature sensing circuit, and current limiting diode—manual reset or automatic reset with return to normal or power up or other functional condition;

24) Active and/or passive protection and functions from fault, ground fault, short circuit, and excess current protection—manual reset or automatic reset with return to normal or power up or other functional condition;

25) Active and/or passive control of over temperature under temperature and functions including: current limiting, burning fuse, and opening a breaker—manual or automatic reset with return to normal or power up or other functional condition; and 26) Active and/or passive load dump protection and functions via clamp circuit, current limiting diode, voltage sensing analog current limiting, voltage sensing switching current limiting, and PTC resistor.

The above objects and other objects, features, and advantages of the present invention are readily apparent from the following detailed description of the best mode for carrying out the invention when taken in connection with the accompanying drawings.

BEST MODE FOR CARRYING OUT THE INVENTION

Figure 1:
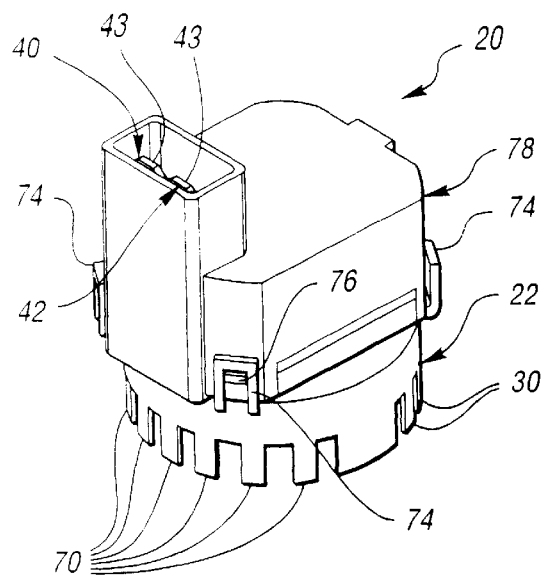
FIG. 1 is a perspective view of a noise suppression in-line module constructed in accordance with the present invention.
Figure 2:
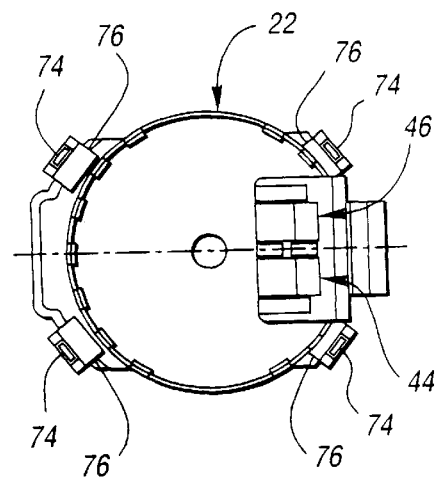
FIG. 2 is a bottom view of the module of FIG. 1.
Figure 3:
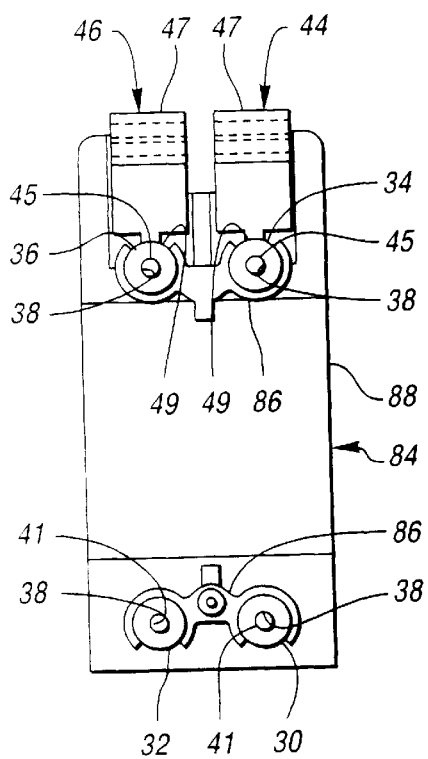
FIG. 3 is a side view of a carrier subassembly of the in-line module.
Figure 4:
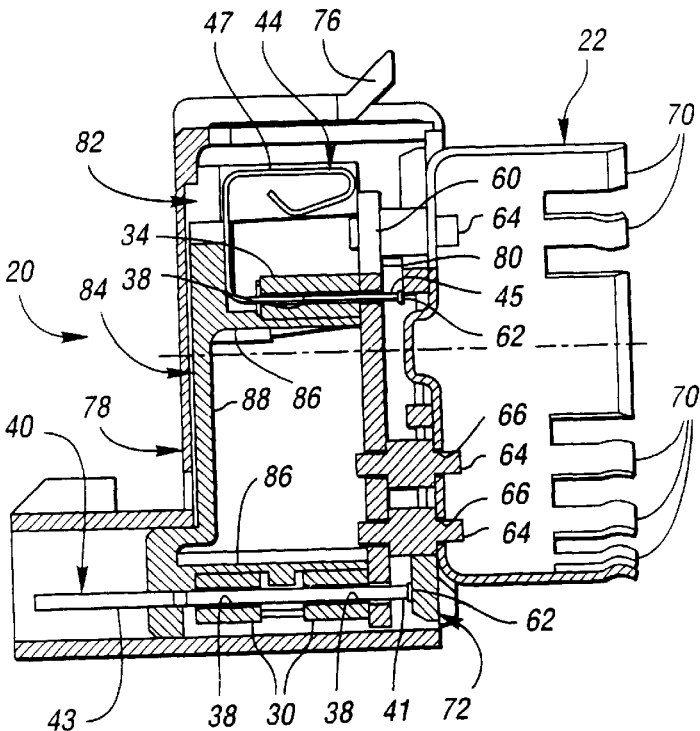
FIG. 4 is a sectional view of the in-line module without the discrete components of the attenuating circuit except the ferrites.
Figure 5:
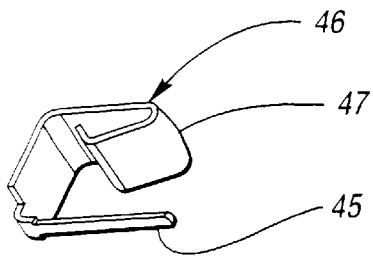
FIG. 5 is a perspective view of a female terminal of the in-line module.
Figure 9:
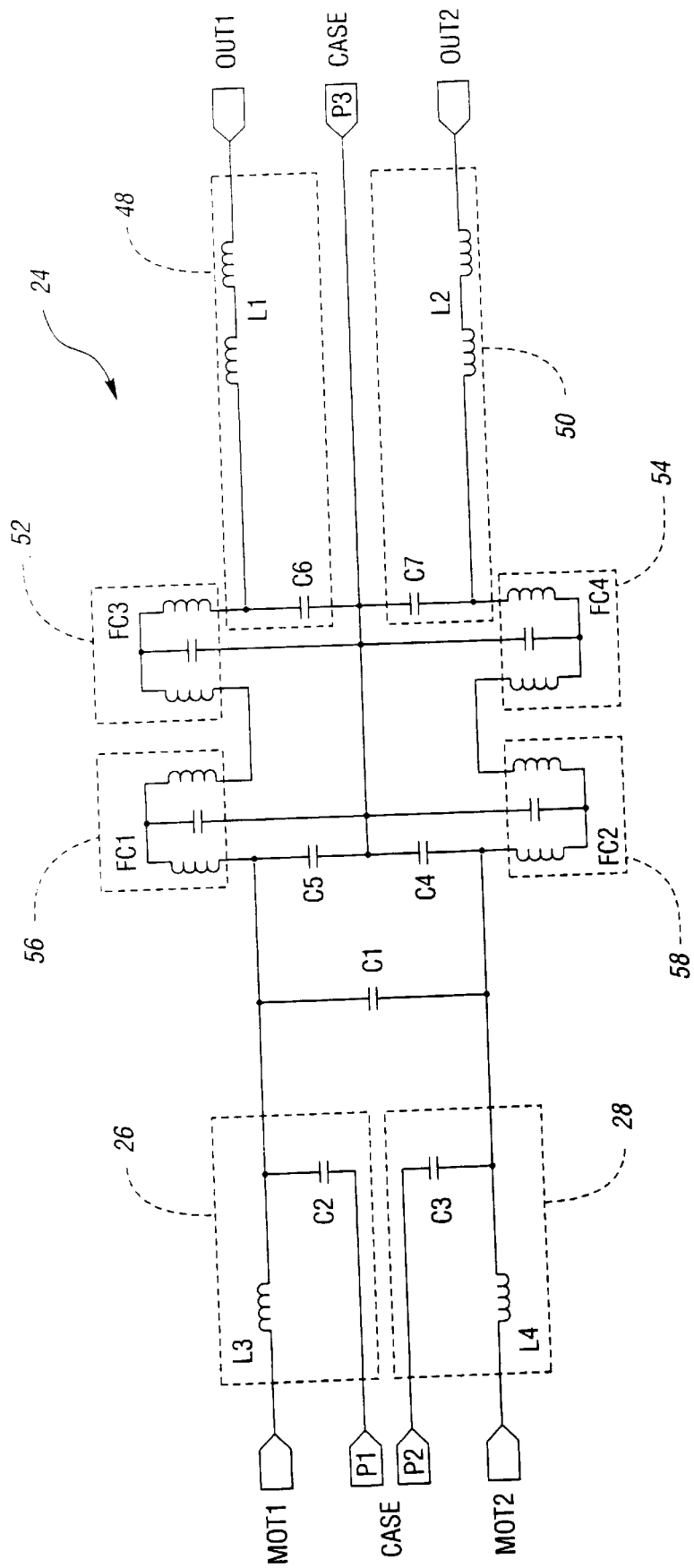
FIG. 9 is a schematic view of an attenuating circuit in the form of a radio frequency interference noise suppression filter network array of the in-line module.

Referring to FIGS. 1 and 4, there is illustrated a typical noise suppression in-line module or assembly, generally indicated at 20, which includes a retainer, generally indicated at 22, which functions as an electrically conducting shield by making multiple electrical connections to the frame of a motor (not shown), and upon which is mounted and electrically connected an electronic low pass filter network array, generally indicated at 24 in FIG. 9.

The filter network array 24 forms the electronic circuit part of the module 20. The circuit or array 24 is essentially a low pass filter network array with high attenuation characteristics across a wide frequency range of conducted electrical noise well above the cut-off frequency.

In the preferred embodiment of the module 20 for the motor application described herein, the components of the array 24 are all passive electronics of the basic types capacitor and inductor. Additional functional materials used include several basic types: dielectric (including insulator), ferromagnetic, and electrical conductor.

In general, inductors of the array 24 perform as RF attenuating filters and low pass series elements, exhibiting increasing impedance to increasing frequency electrical current noise in the radio frequency (RF) spectrum. The complex impedance for an ideal inductor is represented as $Z_L = j \omega L$, units of Ohm, where $j = (-1)^{**}(\frac{1}{2})$, $\omega$=radians/second=$2\pi$Hz, and L=inductance, units of Henry. Inductors filter or attenuate conducted RFI noise currents primarily by reactive and secondarily by their real component of resistive impedance. Also, in general, capacitors of the array 24 perform as RF attenuating filters and high pass shunt elements, exhibiting decreasing impedance to increasing frequency electrical voltages in the RF spectrum and are electrically connected so as to shunt RF electrical current to another circuit node, here being a conductive motor case or frame which acts as a low RF impedance current sink node. The complex impedance for an ideal capacitor is represented as $Z_c = -j/(\omega C)$. Capacitors filter or attenuate conducted RFI noise voltages primarily by reactive and secondarily by their real component of resistive impedance.

Figure 6:
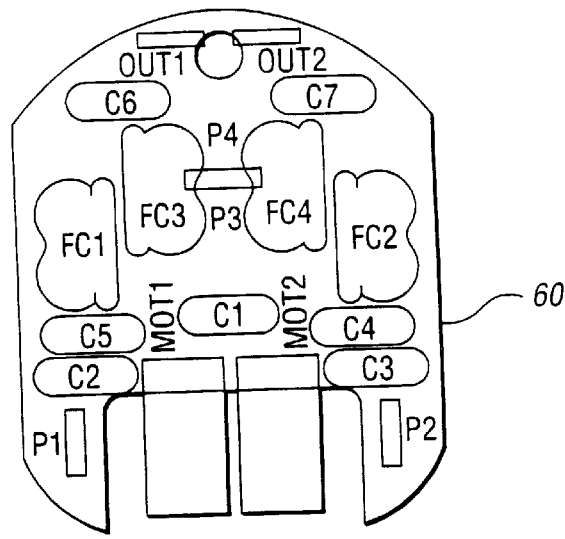
FIG. 6 is a top view of a PC board of the in-line module illustrating circuit component layout thereon.

Referring specifically now to the electronic filter network circuit array 24 of FIG. 9, an inductor L3 and a capacitor C2 form a low pass L-C filter 26 between terminals labeled as MOT1 and CASE (motor). An inductor L4 and a capacitor C3 form a low pass L-C filter 28 between a terminal labeled as MOT2 and determined CASE (motor). These two L-C filters 26 and 28 are symmetrical with regard to: CASE, component values, component size, component type, pc board layout (as illustrated in FIG. 6), and filter attenuation transfer function of the array 24 versus frequency.

A capacitor C1 is a high pass shunt and/or balance which filters differential RFI noise between symmetrical inner circuit nodes adjacent to L3 and L4. The capacitor C1 has high impedance to low frequency power levels but attenuates differential RFI noise between the symmetrical nodes.

A capacitor C5 and a capacitor C4 are symmetrical and act to filter RFI to CASE (motor) from across the capacitor C1.

Referring to FIGS. 1–5 and 9, inductors L1, L2, L3 and L4 are ferrite choke beads or cylinders 30, 32, 34 and 36, respectively, each having an axial through hole 38 for unique placement directly onto and being held captive by design features of special printed circuit board-mounted electrical terminals OUT1, OUT2, MOT1, and MOT2 (i.e. generally indicated at 40, 42, 44 and 46, respectively). This allows the pc board terminals 40, 42, 44 and 46 to function not only as connector terminations but also to pass the electrical current through the ferrite inductors 30, 32, 34 and 36 as might normally be done by a conductor wire or a pc board current trace. Each of the terminals 40 and 42 has a through-connector portion 41 and a male blade portion 43. Each of the terminals 44 and 46 also has a through-connection portion 45 and a female connector portion 47.

The inductor L1 (i.e. 30) and a capacitor C6 form a low pass L-C filter 48 between the terminals labeled as OUT1 (i.e. 40) and CASE (motor). The inductor L2 (i.e. 32) and a capacitor C7 form a low pass L-C filter 50 between the terminals labeled as OUT2 (i.e. 42) and CASE (motor). These two L-C filters 48 and 50 are symmetrical with regard to: CASE, component values, component size, component type, pc board layout (i.e. FIG. 6), and filter attenuation transfer function versus frequency.

The array 24 includes T-filters FC3 and FC4 (i.e. 52 and 54) which are symmetrical with nodes adjacent to the inductor L1 (i.e. 30), the inductor L2 (i.e. 32), respectively. The array 24 also includes T-filters FC1 and FC2 (i.e. 56 and 58, respectively) which are symmetric with the nodes adjacent to FC3 and FC4 (i.e. 52 and 54, respectively). The T-filter symmetry is with regard to: CASE, component values, component size, component type, printed pc layout (i.e. FIG. 6), and filter attenuation transfer function versus frequency.

The entire filter network array 24 is symmetrical with regard to: CASE, component values, component size, component type, pc board layout (i.e. FIG. 6), and filter attenuation transfer function versus frequency.

Passive Electronic Filter

The noise suppression module 20 (i.e. the NSM) incorporates a network array of passive electronic low pass filters C1, C4, C5, 26, 28, 48, 50, 52, 54, 56 and 58 of various types and configurations for attenuation of conducted transmission of RFI noise. Combinations of single element, single pole, double pole, multiple pole, lattice array, inverted "L" section, "T" section and "PI" section configurations of symmetrical and/or unsymmetrical design, low pass filters may be incorporated into the filter network array 20 to meet host system application specifications. Filters primarily include the two basic modes: common mode for one individual conductor and/or one group of conductors and differential mode for two different conductors or groups of conductors. Inductive components can have self-inductance and/or mutual inductance with another (or even the same) current line. Capacitive components can typically have coupled capacitance to a low impedance common node and/or coupled capacitance to another circuit line.

Inductors are series reactive components which impede changes in electrical currents and thus filter high and increasing frequency electrical currents with increasing impedance.

Capacitors are components which shunt or bypass electrical current and thus pass high and increasing frequency electrical voltage caused currents with decreasing impedance. Other than the minimal resistive losses within inductors and capacitors, their respective function in the NSM 20 is to reactively block high frequency interference noise currents or to reactively shunt high frequency voltage produced noise currents to a sink node of the circuit.

R-C and R-L two element filters, when configured as low pass, are single pole filters having a single corner frequency above which the attenuation increases (or the signal decreases) by 40 decibel (dB) per decade, or 12.04 dB per octave asymptotically as the frequency exceeds the corner frequency.

Two pole filters in the low pass configuration have two reactive components and two (possibly coincident) corner frequencies, each adding an increasing attenuation of 20 dB per decade, the total being 40 dB per decade, asymptotically as the frequency exceeds all corner frequencies.

By grouping series inductors and parallel capacitors, as illustrated in FIG. 9, it can be seen that nine reactive elements per symmetrical half will theoretically result in 180 dB per decade attenuation far above the highest corner frequency. Additionally, there is some differential attenuation resulting from the capacitor C1 which gives a total theoretical attenuation of 200 dB per decade. A theoretical analysis can show transfer function inflections, dips, and peaks representative of resonant interaction of the reactive components and effects of resistive impedance.

As the low pass filter network array design gets more complicated by having numerous resistances, capacitors, and inductors, the analytical calculation of its transfer function to electrically conducted noise frequencies gets increasingly complicated. Due to the various field interactions among components, conductive traces, terminals, retainer, motor and the outside environment, and also changes of the passive component properties with temperature, frequency, and layout geometry, a final determination and documentation of the NSM characteristic properties with regard to conducted transmission attenuation is practically an empirical matter.

Functional circuit description by arbitrary choice of filter component grouping can vary. Alternative choices based upon different grouping of circuit elements for description purposes will all result in the same phase, magnitude, quantity, and quality filter transfer function. An example of alternative combining of the network filter array may be to consider there to be five L-C filters in symmetry with five corresponding L-C filters with only capacitor C1 as being a self-symmetrical component. Regardless of element grouping for description, the performance of the filter network array 24 is unchanged.

Figure 8:
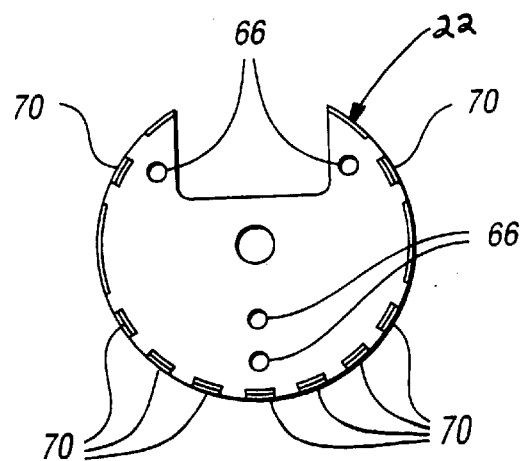
FIG. 8 is a bottom view of a retainer of the in-line module.

Referring now to FIGS. 1, 2, 4, 8 and 9, the retainer 22 performs as an electrically conductive motor end cap, a physical structure for the module, and as the electrical connection named CASE (i.e. FIG. 9) made up of at least three separate engineered structural termination points called P1, P2, and P3 in FIG. 9. The size and location of these retainer terminations relative to a pc board 60 containing the electronic filter network array 24 (including pc board traces 62), affect the NSM transfer function. Conductive terminals/rivets such as rivets 64 of FIG. 4, electrically couple the array 24 to the conductive retainer 22 at four holes 66 as best shown in FIG. 8 (i.e. consequently, four rivets 64 are required). Field emissions from the plastic end of the motor are significantly attenuated by the shielding provided by the electrically conductive retainer 22. Conducted motor emissions are significantly attenuated and filtered primarily by the electronic filter network array 24. Also, field emissions from the wire conductors are significantly reduced by virtue of the attenuation of conducted current noise. The NSM 20 performs its noise suppression and shielding function in a bidirectional manner, but RFI and other field noise is usually of little effect upon the motor (not shown) and is therefore only briefly discussed here.

FIGS. 1–8 show various views of the assembly of the NSM 20. The retainer 22 is tin-plated over a conductive metal retainer having spring-like fingers 70 with which to firmly grasp and make reliable electrical connection with the exterior of the conductive motor cylindrical frame (not shown), thereby performing as an extension of the motor frame for purposes of axial shielding where the plastic end cap of the motor does not shield.

Figure 7:
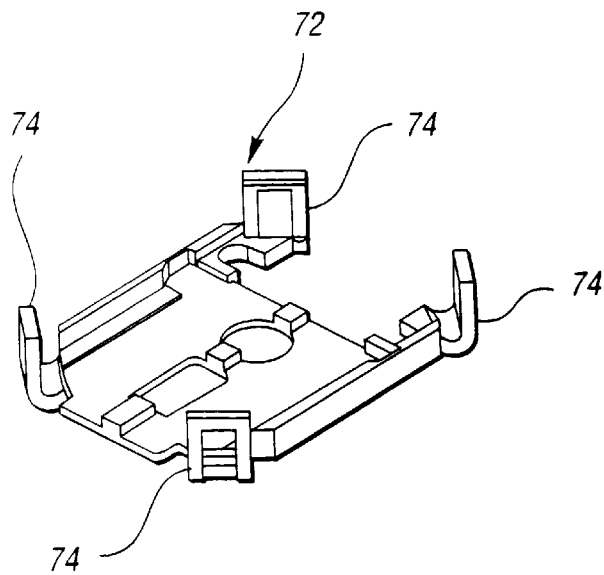
FIG. 7 is a perspective view of a base of the in-line module.

A plastic base, generally indicated at 72 in FIG. 7, has the function of offering snaps 74 with which snaps 76 of a plastic cover, generally indicated at 78, can mate so as to give protection to the terminals 40–46, the filter network array 24, and the pc board 60. The plastic base 72 is held between the pc board 60 and the retainer 22 as illustrated in FIG. 4.

The physical and electrical connection of the pc board 60 to the retainer 22 is made on a lower side 80 of the pc board 60 by the four metal rivets 64 which are inserted into and permanently joined by welding into the corresponding holes 66 of the metal retainer 22. The preferred embodiment relies upon electrical connection from the electrical filter circuit array 24 to the conducting case or housing or frame of the motor. It has been seen that the locations of the rivets 64 relative to the pc board 60 and the retainer 22 have a significant effect upon the attenuation transfer function of the filter network array 24.

The module 20 also includes an insulated carrier subassembly, generally indicated at 82 in FIG. 4 including an integrally formed plastic carrier, generally indicated at 84. The carrier 84 supports the ferromagnetic ceramic cylinders 30, 32, 34, 36 at vertical supports 86 which extend substantially perpendicular to a horizontal support 88 and the pc board 60 so that ends of the through-connector portions 41 and 45 are electrically connected and mounted to the conductive strips 62 formed on the pc board 60.

The horizontal support 88 also supports the male and female connector portions 43 and 47, respectively, of the terminals 40, 42, 44 and 46 to allow a plug-in connection of the module 20 in-line into an electrical system which, as described herein, includes an electrical motor.

Other Applications

The general concept of the ILM includes subset application as a RFI NSM with host devices such as: past production motors, present production motors, future motors, and diverse types of other electrical and electronic noise producing and/or noise sensitive devices for affecting improvement of component and system Electromagnetic Compatibility (EMC) over wide ranges of the frequency spectrum. EMC is here used as including compatibility with regard to emission of and susceptible immunity from excess emissions including all frequencies above and including zero whether internally or externally generated by any and all noise types including: electromagnetic (EM) nearfield and farfield, magnetic field (m-field), electric field (e-field), conducted, and electrostatic discharge.

Applications for a NSM of the present invention (where a potentially steady noise producer is involved) include but are not limited to: motor types of universal, direct current, high current, and high voltage; generator; alternator; switching inverter; switching converter; uninterruptible power supply; ballast of types solid state switching and electromagnetic; battery charger; ignition circuit; microwave oven; radio transmitter types of amplitude modulation, frequency modulation, pulsewidth modulation, pulse position modulation, and pulse frequency modulation; buzzer; gas discharge lamp of types fluorescent, neon, high pressure sodium, low pressure sodium, mercury, metal halide, vacuum fluorescent, and microwave e-lamp; phase control device of types lighting dimmer and motor speed controller; saturable core magnetic reactor; ozone generator; rheostatic control; multiplexed display; non-linear loads; and digital switched power and signal.

Applications for a NSM of the present invention (where a potentially variable noise source is involved) include, but are not limited to: spark ignition engine; welder of types stick, e-beam and plasma arc; inductive heater; plasma arc cutter; and radio frequency heated soldering iron.

Applications for a NSM of the present invention (where a potentially intermittent noise source is discharge device of types welder and animal prod; electronic bug zapper; electronic air cleaner; burner ignition device of type furnace, stove and hot water heater; discharge lamp ignition circuit of type high pressure sodium, low pressure sodium, metal halide, mercury, and xenon; devices susceptible to lightning, solar wind fields, static discharge and geomagnetic storms; solenoid actuator; switch or breaker for power device of type relay, solid state switch, mechanical switch contactor, fuse thermal breaker, mechanical breaker, ground fault interrupter, and fault interrupter; and electric fence.

Applications for a NSM of the present invention (where a potentially sensitive electrical device is involved) include, but are not limited to: sensors of type microphone, thermocouple, smoke alarm, motion detector (infrared and microwave), magnetometers (Hall effect, magnetoresistive, anisotropic MR, giant MR, and colossal MR), eddy current, flux integrator, fluxgate, saturable core, and variable reluctance; radio receivers of type garage door opener, portable paging device, citizens band radio, long wave radio, short wave radio, analog television, and digital television; computer; network system; large area network computer system; wide area network computer system; telephone system; elastomeric switching; preamplifier for high impedance transducer sensor signal; security system; multiplex system of type automotive and plant; battery operated low power devices; and power outlets for non-standard and standard power of type 120 VAC, 208 VAC, 240 VAC, 270 VAC, and 480 VAC, and the like.

Major benefits specific to the RFI NSM motor application include not only the attenuation of emitted and received RFI noise fields but also attenuation of conducted RFI noise as is typically produced by commutation of electrical currents. Wideband RFI noise is created by sparking and arcing as is common with commutation via carbon brushes, graphite brushes and metallic brushes. Motors having worn and/or burned brushes, weak brush springs, excessive commutation gaps from worn bushings and bearings, worn and/or burned commutation segments, overspeed no-load operation (which can be a result of a previous very cold temperature stalled rotor operation), commutation gap contamination (dirt, brush dust, metal shavings, melted solder, etc.) all tend toward having increased sparking and arcing problems. Other types of motor current commutation can also produce RFI noise of typically less severe quantity. These commutation methods include, but are not limited to: line commutation, forced current commutation, forced voltage commutation, solid state power switching commutation using such switching devices as thyristors, silicon controlled rectifiers (SCRs), triacs, field effect transistors (FETs), metal oxide semiconductor FETs (MOSFETs), gate turn-off semiconductors (GTOs), bipolar transistors, and also newer types of power semiconductor switches. The RFI noise produced by signal level devices can be quantitatively less severe than that of power devices but signals having high switching speeds with high slew rates produce broad band noise emission spectra, thus there can be significant opportunity for application of NSM devices not only to attenuate production of signal level noise but also for protection of sensitive signal level circuits susceptible to RFI.

Optional Module Features

The devices with which the ILM or NSM will interface are not required to be electrically grounded, although an electrically grounded motor case can perform fine for most applications.

An optional form of the NSM is as a device engineered for placement within a motor case which, if the case is sufficiently electrically conductive, can allow for elimination of the NSM retainer 22, the plastic base 72, the carrier subassembly 82 and the housing cover 78.

Additional design options include numerous functional control features plus electrical conduction modes of immunity, protection, attenuation, and compatibility including, but not limited to: conducted RFI current and/or voltage noise; electrostatic discharge; reverse voltage; overvoltage or undervoltage; overcurrent or undercurrent; short circuit and/or ground fault; over temperature or under temperature; historical operation data; fault operation codes and communication; and other various types of functional monitoring and control algorithm features. In addition to noise suppression characteristics, the in-line module 20 can also incorporate diverse features including: integral inputs, additional wired remote inputs, integral outputs, and remote wired outputs. The in-line module 20 can be used for diverse monitoring and control functions when incorporated within an existing system. For example, the in-line module 20 may go between and modify some signal information which is passed along to or from between the host system and its remote device thus resulting in altered system performance functionality without necessary awareness of the host that new monitoring and control features have been added.

Many of the above-mentioned monitoring and control functions can be performed with active and/or passive circuitry. Examples of these are as follows:

1) Electrostatic discharge protection via: static dissipative construction and materials; zener diodes; diodes; capacitors; series resistors; bleed resistors; and active static sensing circuits having a controlled output such as enabling a discharge circuit, setting a fault code, and tripping an alarm function;

2) Reverse voltage protection via: blocking diode; current limiting diode; active analog control current limiting circuit; active digital switching control current limiting circuit; and sensing circuit with functional output such as setting a fault code, shutting down operation until manual or automatic reset, and blowing a fuse or breaker;

3) Bidirectional overcurrent and/or undercurrent protection and/or fault (short) currents protection via: fuse; current limiting diode; active analog control current limiting circuit; active digital switching control current limiting circuit; positive temperature coefficient (PTC) resistor; current energized thermal bimetallic cutout switch; thermal circuit breaker; magnetic circuit breaker; crowbar circuit; and current sensing circuit with functional output such as setting a fault code, shutting down operation until manual or automatic reset (by power up or end fault condition), and activating a light or alarm;

4) Bidirectional overvoltage and/or undervoltage and/or phase failure protection via: methods similar to bidirectional overcurrent protection (above) with similar types of control function outputs plus use of components such as zener diodes, metal oxide varistors (MOV), gas discharge devices, and transorb(tm) surge protective devices;

5) Load dump protection via: methods similar to bidirectional overvoltage protection (above) with similar types of control function outputs;

6) Overtemperature and undertemperature protection via: functional monitoring and control as setting a fault code, partial shutdown, full shutdown, automatic resetting, power up resetting, modification of operational parameters, changing clock speeds, and modification of interactive adaptation algorithms; and 7) Other sensor inputs such as but not limited to: pressure sensing, altimeter sensing, flow sensing, speed sensing, position sensing, magnetic field sensing, electric field sensing, force sensing, time sensing, capacitance sensing, inductance sensing, depth sensing, attitude sensing, light sensing, sound sensing, voltage sensing, electrical current sensing, charge sensing, EM field sensing, color sensing, light intensity sensing, mass sensing, momentum sensing, energy sensing, power sensing, torque sensing, voice sensing (for processing and recognition), and the like from over 100 physical variables that can be measured.

As an overview, the control functions and modifications thereof listed above are generally applicable whenever and wherever they are desired for implementation. Higher levels of control logic when coupled with appropriate inputs, outputs and communication thus enable implementation of interactive, adaptive and self-programming functions for systems with increasing complexity provided by the ILM. Incorporation of dielectric materials, magnetic materials, structural materials, plus electrical circuits of such types as: passive, active, analog, digital, microcontroller, microprocessor, and combinations and/or multiples thereof are all typical anticipated methods by which to implement desired ILM features and functions as per above disclosure. Application and specifications drive the determination of the final engineered form and function for the ILM, whether it becomes a NSM and/or it becomes a higher or lower level functional module.

Typical analog and digital electrical inputs and signals for the ILM include but are not limited to: power, ground, neutral, select circuit node, switches, keypads, data lines, data coded on power lines, EM communication, magnetic field communication, electric field communication, and other transducing sensors. Typical types of analog signals include but are not limited to: mean voltage levels, alternating voltage levels, voltage waveforms, mean current levels, alternating current levels, current waveforms, amplitude modulation, frequency modulation, duty cycle modulation, pulse position modulation, and combinations thereof. Typical types of digital signals include but are not limited to: frequency modulation, duty cycle modulation, pulse position modulation, digital coding, and combinations thereof. Combinations of both digital and analog signals for coding and decoding circuitry are considered as technically feasible, as required for size, cost, security, and specifications. Should the in-line module require operational power, it can operate in a parasitic mode from the system host; receive power via mechanical method(s); have additional wire(s) for connection to other circuit power node(s); have additional connection(s) for fiber optic supplied power; and/or use a contactless method for receiving power via optics, fields, sonics and the like.

Possible outputs include but are not limited to: analog and/or digital communication on electrical line(s), fiber optic line(s), vibration passing (including sonic, ultrasonic, and vibration); mechanical signal and power to remote devices; power output to proximal devices; power output to integral devices; EM communication (including optical methods); magnetic field communication; electric field communication; indicator lamps; voice synthesis; and audible annunciator.

Functional control algorithms can be implemented via digital circuitry, analog circuitry, microcontroller, microprocessor, combinations thereof, and the like. The types of functional control and monitoring can include but are not limited to: open loop controls via lookup tables and algorithms; closed loop controls via lookup tables and algorithms plus implementing such feedback modes as proportionate, integral, differential, higher or lower order functions, and combinations thereof; history of operation; error mode information communication; operational shutdown; partial operational shutdown; change of operational function mode(s); and dynamic interactive modification of functional operational input signals, output(s), processing parameters, and variables.

Components

Many alternatives exist for choices of materials, methods, configurations, features, qualities, and quantities involved, pertinent to the motor, regulations, and application specifications. The RFI NSM can additionally include active and/or passive components not shown in the preferred embodiment, such as resistors, semiconductors, permanent magnets, electrets, and the like.

Inductors, also known as chokes, are used as magnetic field energy storage reactive devices, having magnetic material chosen for properties suitable to the application needs. The ideal but not actual power and energy dissipated is zero. In the case of RFI, suitable magnetic material choices are, but are not limited to: ceramic ferrite, unsintered powder metal, and air. The ideal magnetic material should have very high magnetic permeability (M/H), high magnetic saturation level, zero coercivity (Amp-turns per meter), zero residual induction (Weber per square meter), zero magnetic (M-H) hysteresis, infinite Curie temperature, selectable tempco, and zero bulk electrical conductivity (or infinite bulk resistivity) to minimize eddy current losses.

The preferred inductive components will typically have geometries resulting in closed magnetic circuits so as to reduce external emanating and fringing magnetic fields, which can have detrimental field effects upon proximal components and/or field transmission within the small confines of the engineered NSM. In some applications, a permanent (hard) magnet is placed within the soft magnetic material circuit to bias the magnetic material against the direct current bias which would normally be produced by the operational current of the electrical circuit for which only RFI is desired to be attenuated, thus allowing for significant improvement in size and performance of the engineered inductor element.

In the case of RFI applications, choices for inductors are made with regard to properties including: temperature coefficient (tempco), applied volt seconds, inductor accuracy, accuracy drift, external field generation, size, heat generation, characteristic non-linear reactance versus operating frequency (actually becoming capacitive at very high frequency), availability, and cost.

Capacitors are used as electric field energy storage reactive devices, having dielectric material chosen for properties suitable to the application needs. The ideal but not actual real power and energy dissipated is zero. In the case of RFI, suitable dielectric material choices are, but not limited to: air; vacuum; mica; tantalum; barium titanate; lead titanate; barium niobate; lead niobate; strontium niobate; a wide variety of metal (barium, strontium, calcium and bismuth) oxides of titanium, zirconium, tin, and niobium; various ceramic types, oils, polymer films, and others.

The ideal dielectric material should have very high dielectric constant (permitivity=D/E, D=(Coulomb/cm-squared, E=(KV/cm)), high voltage (or bias) sensitivity (KV/cm), infinite dielectric strength (breakdown voltage), zero residual polarization (Coulomb/cm-squared), zero dielectric hysteresis (D-E), zero dielectric absorption (memory effect), infinite Curie temperature, selectable tempco, and zero electrical conductivity (or infinite bulk resistivity).

The preferred capacitive components will have geometries resulting in reduced external emanating fringing electrical fields which can have detrimental effects on proximal components and/or field transmission within the small confines of the engineered NSM. In some applications, a special dielectric electret material is used having an electrical polarization bias which can allow for significant improvement in size and performance of the engineered capacitive component.

In the case of RFI applications, choices for capacitors are made with regard to properties of tempco, applied voltage, capacitance accuracy, capacitance drift, external field generation, size, heat generation, characteristic non-linear reactance versus frequency (actually becoming inductive with increasing frequency), availability, and cost.

Given the non-ideal characteristics of inductive and capacitive components used in the RFI NSM with various operating conditions including voltage, current, frequency, and temperature, the application specifications can require balanced choices where the variations of inductors and capacitors cancel out each other and/or the motor noise generation characteristics within acceptable tolerances.

Resistors are used as electrical energy dissipative devices. Choices of resistors are made with regard to properties of temperature coefficient (tempco), temperature range, resistive accuracy, resistive tolerance, resistive drift, frequency inductive characteristic, noise generation, size, power capability and derating, and heat generation.

Electrical Termination

Engineering choices for the electrical termination of the NSM include: integral connector, pigtail (wiring bundle with no connector), and wiring bundle with connector. The integral connector design puts significant burden of responsibility onto the customer and/or user for matters of: electrical connectivity, connector environmental sealing, wire and bundle routing, and wiring emissivity and susceptibility.

As the application requires, the NSM can incorporate various features into the wiring external to the conductive housing. Shielding of individual wires, groups of wires, all of the wires together, and/or combinations thereof can effectively reduce emissivity and susceptibility of the wiring bundle plus reduce "crosstalk" between various individual wires or groups of wires within the bundle, as required. Braid, foil, and drain wires are forms of shielding which have electrical connection options of being: floating, grounding at one (or not preferably both) end(s), tied to motor chassis, tied to one of the wires in the bundle, or tied to a node created within the NSM.

One basic method of reduction of emissivity and susceptibility to m-fields in differential mode with two wires or groups of wires is the twisting of the pairs or groups of wires. This wire twisting process, when extended beyond simple twisting of wire pairs, leads to the sometimes used method of more complicated braiding of part or all of the wires in the bundle. Commercial forms of some complicated braided wire is available and can be useful for various applications of the NSM.

Even the type of wire used in the bundles can affect the RFI characteristics of the NSM. Use of same AWG size wire but having fewer and larger strands will result in an increase in impedance with increase in frequency, including RFI, but have no effect upon lower frequency currents. This principle is used in reverse with high quantities of very fine wire used for high frequency conducted transmission applications (refer to Litz wire). It is important, as an engineering application tradeoff, to be aware of the reduction in mechanical fatigue life as the wire strand diameter is increased.

An alternative option for consideration is the use of a special engineered alloy wire or preferentially an alloy coated wire. The alloy of choice will have higher bulk resistance than the main core of the wire, thus the net wire resistivity is low for the relatively low frequency motor currents and/or signals which use the entire cross-section of the wire for electrical current conduction, but the higher frequency RFI noise signals will be attenuated by the higher bulk resistance of the conductive wire coating predominantly due to the electrical currents traveling primarily on the surface of the conductor wires (refer to "skin effect").

The connector of the NSM can incorporate several features which will improve performance in various ways. In the type of design where the connector protrudes from the electrically shielded version of the NSM housing, it can incorporate its own integral shield. For high frequency signals, every place the reactive impedance of the conducted transmission line changes, there is generated a reflected signal. Especially for applications using high slew rate signals, the amount of reflected noise on the supply wires increases when wiring impedance changes in an unintended manner, such as through a poor electrical connection.

Improved contact design incorporating less corrosive and higher conductivity metal plating is a basic method often used to obtain reliable connections. Additionally, contact treatments can give improved electrical connectivity resulting in longer functional life with lower noise. A type of treatment available on the market today is one of various forms of a glycol which remains between the interstesis of mating electrical contacts to act as a semiconductor giving additional and improved electrical continuity only when the electrical gradient is sufficient high. Other types of electrical contact treatments on the market act to clean, reduce oxidation, and leave a protective barrier coating which retards accumulation of contaminants.

The diverse engineering choices for the NSM are based primarily on: application specifications of the customer, industry standards, professional society standards, and government regulations.

Housing

The RFI NSM also allows for application specific options in its manner of packaging. An alternate electronic filter network array is surrounded by an electrically conductive shield. This alternate embodiment uses an electrically conductive housing which is electrically connected, preferably with a gas-tight metallurgical bond, in several or many points or, ideally, continuously to the metallic motor housing, thus producing a partial Faraday shield or cage having low impedance to RF electrical current and which thus shields the internal components of the filter network array from external fields and shields the external environment from internal fields of the contactless modes of noise transmission.

Various alternative choices for the method of attachment of the housing to the motor include but are not limited to: press fit, interference fit, snap with metallic fingers, crimp, swage, rivet, orbital rivet, conductive adhesive, solder with one of various solder types, braze with one of various types of braze material, threaded fastener, and weld (including: stick, resistance, spot, laser, e-beam, MIG, TIG and spin).

An alternative field retrofit design option is for the NSM to incorporate its own more complete version of a partial Faraday shield surrounding the electronic filter network array, possibly in the form of a metallic or metallized housing cover well electrically connected to an electrically conductive retainer so as to form a conductive Faraday shield. EM fields, e-fields, and m-fields, all of the RFI type, are attenuated by surface and eddy currents on and within the electrically conductive Faraday shield.

In applications where EM, e-field, and m-field shielding is not sufficient or appropriate for the application or unusual requirements dictate, it is possible with periodic fields and/or relatively slowly changing fields to sense and then generate field(s) to attenuate (out of phase), to amplify (in phase), to offset shift, time shift, phase shift and even produce a desired net field with no relationship to the ambient sensed field.

Considerations for corrosion protection of the NSM and motor include various techniques such as: tin plating, sacrificial corrosive coating (such as zinc) allowing preferential corrosion of the more active metal; oxygen activity reduction by applied coatings of oil, wax, organic, paint, and organometallic; and anodic protection provided by a sacrificial galvanic cell anode driven to selectively corrode as powered by an electrical circuit.

For many motor types and applications, the motor housing is not grounded, thus the partial Faraday cage will also be at an electrically "floating" potential. The NSM retainer, whether electrically grounded or electrically common with the motor housing, or electrically tied to any stable electrical circuit node or electrically isolated will still perform the function of field shielding via electrical Faraday shield or cage. With the understanding that the skin effect limits the depth of penetration of electrical current into an electrical conductor with increasing frequency, for increased shielding effectiveness, an NSM housing cover design choice is to have a housing cover shield composed of multiple thin electrically conducting shields in the form of films, foils, and/or very thin sheets of metal. These multiple conducting shield layers can individually be electrically connected together, left at a floating potential, and/or tied to any other circuit node, as appropriate, such as the motor frame to meet all system application functional requirements.

The method of use of multiple thin conductive layers for shielding can also be used within the pc board. A single ground plane is often left on many pc boards for shielding and electrical guard purposes. Improved attenuation is possible with engineered designs incorporating multiple thin conductive layers separated by dielectric insulation within the pc board.

Improved Faraday shield function is achieved with increased housing cover electrical conductivity and with increased housing cover coverage area and electrical connectivity to the retainer. Openings in the conductive shield allow for undesired passage of field transmission as well as conducted transmission. The ideal, but impractical, Faraday shield would have entirely closed (possibly spherical) geometry of some infinitely conductive material, although silver and tin are of very high and practical conductivity for use in many applications.

Alternatives for the housing cover include use of a highly electrically conductive material which will have high surface electrical current capability for all RFI field transmission modes. Conductive materials for consideration include but are not limited to: copper, aluminum, silver, gold, zinc, magnesium, brass, stainless steel, nickel, steel, alloys of the aforementioned, graphite and carbon black and mixtures of the aforementioned. Typical fabrication methods for making the NSM housing include: stamping; progressive deep-drawn stamping; casting; rolling; forging; machining; welding; soldering; brazing and sintered and/or unsintered variations of powder metal technology such as hot isostatic pressing (HIP), metal injection molding (MIM, using thermal and/or chemical debinderizing methods), standard pressing, high pressure pressing, restrike pressing, and newer techniques yielding very high densities.

Alternative methods to impart the desired electrically conductive properties to the non-conductive or poorly conducting housing cover material include applying conductive material to the surface and/or within the bulk of the housing body. Surface metallic conductivity can be imparted via: plasma arc spraying, flash deposition, electroplating, mechanical working, conductive paint application, flame carbonizing, and more. Volume fraction conductivity can be imparted via: addition of electrically conducting components (such as graphite, carbon, nickel, silver, tin, gold, etc.) in the form of fiber, powder, flake, microspheres, Fullerenes (Buckyballs), etc. into the base material. Non-electrically conductive base materials can include plastic and ceramic.

Shielding of RFI m-fields is typically performed by surrounding the sensitive or emitting circuit components with magnetic material capable of performing at these higher frequencies. Increasingly above a range of 2 KHz to 3 KHz typical conductive magnetic materials lose their effective magnetic properties because the electrical conductivity related eddy current effects take over in predominance. Certain types of magnetic materials retain effective magnetic properties into the higher RF range by virtue of their form, having designed-in high bulk resistivity (low conductivity). Examples of these ferromagnetic material types include: unsintered powder metals, ceramics, and plastic or ceramic filled with powders of metal or ceramic.

The NSM housing cover can incorporate a layer of RF magnetic material within or without to give appropriate m-field shielding capability. Specific shielding for RFI noise m-fields by use of high frequency magnetic materials is usually not necessary because a low cost and highly conductive electrically conductive shield surrounding the sensitive and/or offending device will usually generate sufficient eddy currents to oppose the source RFI m-fields with the net resultant m-field amplitude being sufficiently attenuated while avoiding the cost, complexity, and weight of high frequency magnetic materials.

Layout of the components on the printed circuit board has an increasingly important effect upon higher frequencies where the physical length and spacing of the circuit traces and component leads becomes close to various fractions of wavelengths corresponding to standing waves and resonances of those frequencies. The ideal filter would have zero size, thus acting like a good antenna primarily only for the highest frequency, but this is unachievable. Component layout and spacing on the pc board can, at some frequencies effectively act as miniature antennas having emissivity and susceptibility, typically in the GHz frequency range. These antennas may be of various types including strip, microstrip, monopole, dipole, loop, or other.

The circuit can also set up standing waves and field resonance with the electrically conductive retainer and/or the optionally electrically conductive housing. Selective engineering allows for designing out, or even intentionally designing in for remote field communication mode(s), resonances of specific frequency ranges by appropriate circuit components and layout. Orientation of the circuit layout in a three-dimensional non-planar array can reduce peak directional magnitudes of antenna emissivity and susceptibility.

Effectiveness of the filter for attenuation of field modes of transmission is typically improved when the filter is located closer to the source of the noise. Shorter lead lengths will typically increase the frequency at which field modes of transmission become significant due to antenna effects.

EM field considerations of the engineered NSM housing design must take into account various features. The housing with the wire bundle out acts as an antenna having possible monopole and some dipole antenna quality. Factors which affect the emissivity and susceptibility of the wire bundle as an antenna are: wire lengths, relative wire lengths, orientation of the individual wires, external proximal emissivity and susceptibility matching characteristics, capacitive coupling between the wire bundle and the NSM where the wire bundle leaves the NSM, and frequency and magnitude of the voltages and currents on the wires.

The wire bundle can act as a dipole antenna, in which case a differential mode filter circuit is appropriate to attenuate conducted transmissions of the offending frequency. The wire bundle can also act as a monopole antenna to and from the motor for which use of a common mode filter circuit would be applicable to attenuate conducted transmissions of the offending frequency.

Engineering specifications can require some combination of filter components to provide both differential and common mode filter components for conducted noise attenuation. Field modes of transmission are also produced by conducted transmissions in wiring. Thus effective filtration of conducted transmission can effectively reduce field transmissions to an acceptable level with little or no shielding requirements. The geometry and material properties of the components and circuitry will affect the EM resonant frequencies, such as in a waveguide and thus have direct bearing on EM RFI characteristics of the system. Engineering design of the circuit, materials, and geometry (including orientation of circuitry in a three-dimensional array for reduction of specific planar orientations) within the inside of the NSM housing can result in a system that selectively attenuates specific EM emissivity, susceptibility, and directionality.

While the best mode for carrying out the invention has been described in detail, those familiar with the art to which this invention relates will recognize various alternative designs and embodiments for practicing the invention as defined by the following claims.

What is claimed is:

1. An in-line module for attenuating electrical noise, the in-line module comprising:

a board having printed circuits formed thereon;

an attenuating circuit including a first set of discrete components mounted on the board and a second set of discrete components electrically connected to the first set of discrete components, each of the second set of discrete components having a cylindrical body with an axial bore extending through a central portion thereof;

an insulating carrier subassembly for supporting the second set of discrete components; and a plurality of terminals including male blade terminals and female terminals, each of the terminals having a through-connector portion disposed in the axial bore of its respective cylindrical body and coupled therewith and with its respective printed circuit, the terminals facilitating the connection of the in-line module in an electrical system and passing current through the cylindrical bodies.

2. The in-line module as claimed in claim 1 wherein each of the cylindrical bodies is a cylindrical ferromagnetic body electromagnetically coupled to its respective terminal.

3. The in-line module as claimed in claim 1 wherein the attenuating circuit includes a filter network array.

4. The in-line module as claimed in claim 1 wherein each of the second set of discrete components is an inductor formed as a ferrite choke bead.

* * * * *